United States Patent
Shih et al.

(10) Patent No.: US 11,757,003 B2
(45) Date of Patent: Sep. 12, 2023

(54) BONDING WAFER STRUCTURE AND METHOD OF MANUFACTURING THE SAME

(71) Applicant: GlobalWafers Co., Ltd., Hsinchu (TW)

(72) Inventors: Ying-Ru Shih, Hsinchu (TW); Wei Li Wu, Hsinchu (TW); Hung-Chang Lo, Hsinchu (TW)

(73) Assignee: GlobalWafers Co., Ltd., Hsinchu (TW)

(*) Notice: Subject to any disclaimer, the term of this patent is extended or adjusted under 35 U.S.C. 154(b) by 64 days.

(21) Appl. No.: 17/368,845

(22) Filed: Jul. 7, 2021

(65) Prior Publication Data
US 2022/0028977 A1    Jan. 27, 2022

(30) Foreign Application Priority Data
Jul. 24, 2020   (TW) ................................ 109125054

(51) Int. Cl.
| H01L 29/16 | (2006.01) |
| H01L 21/02 | (2006.01) |
| H01L 21/304 | (2006.01) |

(52) U.S. Cl.
CPC .... H01L 29/1608 (2013.01); H01L 21/02008 (2013.01); H01L 21/02378 (2013.01); H01L 21/304 (2013.01)

(58) Field of Classification Search
CPC .......... H01L 29/1608; H01L 21/02008; H01L 21/02378; H01L 21/304; H01L 21/0445; H01L 21/30625; H01L 21/76254; H01L 21/76256; H01L 21/02002; H01L 21/185; H01L 21/76251–76264; H01L 24/00–98; H01L 2224/26–33519
See application file for complete search history.

(56) References Cited

U.S. PATENT DOCUMENTS

| 10,711,373 | B2* | 7/2020 | Kubota | ............. H01L 21/02658 |
| 2006/0225645 | A1 | 10/2006 | Powell et al. | |
| 2011/0233562 | A1 | 9/2011 | Harada et al. | |
| 2016/0032486 | A1 | 2/2016 | Hansen et al. | |
| 2018/0251911 | A1 | 9/2018 | Kubota et al. | |
| 2019/0106811 | A1 | 4/2019 | Lin et al. | |

FOREIGN PATENT DOCUMENTS

| CN | 104876180 | 9/2015 |
| CN | 105590996 | 5/2016 |
| CN | 107464786 | 10/2019 |
| TW | 201611098 | 3/2016 |

OTHER PUBLICATIONS

"Office Action of France Counterpart Application", dated Jul. 26, 2022, p. 1-p. 9.

* cited by examiner

Primary Examiner — Cuong B Nguyen
(74) Attorney, Agent, or Firm — JCIPRNET

(57) ABSTRACT

A bonding wafer structure includes a support substrate, a bonding layer, and a silicon carbide (SiC) layer. The bonding layer is formed on a surface of the support substrate, and the SiC layer is bonded onto the bonding layer, in which a carbon surface of the SiC layer is in direct contact with the bonding layer. The SiC layer has a basal plane dislocation (BPD) of 1,000 ea/cm$^2$ to 20,000 ea/cm$^2$, a total thickness variation (TTV) greater than that of the support substrate, and a diameter equal to or less than that of the support substrate. The bonding wafer structure has a TTV of less than 10 μm, a bow of less than 30 μm, and a warp of less than 60 μm.

17 Claims, 3 Drawing Sheets

BONDING WAFER STRUCTURE AND METHOD OF MANUFACTURING THE SAME

CROSS-REFERENCE TO RELATED APPLICATION

This application claims the priority benefit of Taiwan application serial no. 109125054, filed on Jul. 24, 2020. The entirety of the above-mentioned patent application is hereby incorporated by reference herein and made a part of this specification.

BACKGROUND

Technical Field

The disclosure relates to a semiconductor bonding technology, and particularly relates to a bonding wafer structure and a method of manufacturing the same.

Related Art

Epitaxy refers to a technique of growing new crystals on a wafer to form a semiconductor layer. Since a film formed by an epitaxial process has advantages such as high purity and good thickness control, epitaxy has been widely used in the manufacture of radio frequency (RF) devices or power devices.

However, in common epitaxially grown wafers or ingots, an epitaxial structure adjacent to a seed crystal is usually discarded due to defects and high stress, and only an epitaxial structure of relatively good quality is retained. As a result, the waste cost is increased.

SUMMARY

The disclosure provides a bonding wafer structure, in which the cost can be reduced and a silicon carbide wafer of poor quality can be used in a substrate for bonding.

The disclosure also provides a method of manufacturing a bonding wafer structure, in which a bonding wafer structure for an epitaxial process for a radio frequency device or a power device is manufactured.

A bonding wafer structure of the disclosure includes a support substrate, a bonding layer, and a silicon carbide layer. The bonding layer is formed on a surface of the support substrate, and the silicon carbide layer is bonded onto the bonding layer, in which a carbon surface of the silicon carbide layer is in direct contact with the bonding layer. The silicon carbide layer has a basal plane dislocation (BPD) of 1,000 ea/cm$^2$ to 20,000 ea/cm$^2$, a total thickness variation (TTV) greater than that of the support substrate, and a diameter equal to or less than that of the support substrate. The bonding wafer structure has a TTV of less than 10 μm, a bow of less than 30 μm, and a warp of less than 60 μm.

In one embodiment of the disclosure, the bonding layer has a softening point of 50° C. to 200° C., a thickness of less than 100 μm, and uniformity of less than 10%.

In one embodiment of the disclosure, the support substrate has a TTV of less than 3 μm, a bow of less than 20 μm, a warp of less than 40 μm, and a Young's modulus of greater than 160 GPa.

In one embodiment of the disclosure, the support substrate includes a single-layer or multi-layer structure, and the bonding layer includes a single-layer or multi-layer structure.

In one embodiment of the disclosure, a concentricity of the silicon carbide layer and the support substrate is less than 1 mm.

In one embodiment of the disclosure, the bonding wafer structure may further include an epitaxy silicon carbide substrate bonded to a silicon surface of the silicon carbide layer. The epitaxy silicon carbide substrate has a BPD less than that of the silicon carbide layer, and has a stress less than that of the silicon carbide layer.

In one embodiment of the disclosure, the bonding wafer structure may further include an ion implantation region formed within the epitaxy silicon carbide substrate. The ion implantation region is at a distance of within about 1 μm from a bonding surface between the epitaxy silicon carbide substrate and the silicon carbide layer.

In one embodiment of the disclosure, the silicon carbide layer has a thickness of less than 500 μm, and the bonding wafer structure has a thickness of less than 2,000 μm.

A method of manufacturing a bonding wafer structure of the disclosure includes the following. Coating is performed and a bonding layer is formed on a surface of a support substrate. A carbon surface of a silicon carbide layer is bonded onto the bonding layer. The silicon carbide layer has a TTV greater than that of the support substrate, a diameter equal to or less than that of the support substrate, and a BPD of 1,000 ea/cm$^2$ to 20,000 ea/cm$^2$. The silicon carbide layer has a bow of greater than 75 μm and a warp of greater than 150 μm before bonding. Then, a silicon surface of the silicon carbide layer is ground to reduce a thickness of the silicon carbide layer. The silicon surface of the silicon carbide layer after grinding is polished to obtain a bonding wafer structure. The bonding wafer structure has a TTV of less than 10 μm, a bow of less than 30 μm, and a warp of less than 60 μm.

In another embodiment of the disclosure, a method of bonding the carbon surface of the silicon carbide layer onto the bonding layer includes the following. A flat of the support substrate is aligned with a flat of the silicon carbide layer.

In another embodiment of the disclosure, a load of bonding the carbon surface of the silicon carbide layer onto the bonding layer is 8 kgf to 10 kgf.

In another embodiment of the disclosure, the following may further be included. After the carbon surface of the silicon carbide layer is bonded onto the bonding layer, residual material of the bonding layer is removed and the support substrate is cleaned.

In another embodiment of the disclosure, the thickness of the silicon carbide layer reduced by the grinding is 5 μm to 12 μm.

In another embodiment of the disclosure, the silicon carbide layer before the bonding and the bonding wafer structure after the polishing have a change (Δbow) in bow of greater than 80 μm, and a change (Δwarp) in warp of greater than 160 μm.

In another embodiment of the disclosure, a method of performing coating and forming the bonding layer includes the following. Wax is spin-coated on the surface of the support substrate at a temperature of 110° C. to 130° C.

In another embodiment of the disclosure, the following may further be included. Before the silicon surface of the silicon carbide layer is ground, a TTV of the support substrate, the bonding layer and the silicon carbide layer that are bonded together is measured. If the measured TTV is less than 10 μm, a subsequent step is performed. If equal to or greater than 10 μm, the following may be included. The bonding layer and the silicon carbide layer are removed, and then again, coating is performed and a bonding layer is formed on the surface of the support substrate.

In another embodiment of the disclosure, the polishing includes rough polishing and fine polishing.

Based on the above, the bonding wafer structure of the disclosure basically includes a three-layer structure in which a silicon carbide layer of low quality (high stress) is provided to replace part of an existing support substrate. This silicon carbide layer is waste removed after epitaxial growth. By using the silicon carbide layer in a bonding structure, not only the material cost of the support substrate and the waste cost can be reduced, but the silicon carbide layer can be directly bonded to the epitaxy silicon carbide substrate, thereby improving the yield of wafer bonding. The bonding wafer structure of the disclosure is suitable for application in a manufacturing process of a power device or a radio frequency (RF) device.

To make the aforementioned more comprehensible, embodiments accompanied with drawings are described in detail as follows.

DESCRIPTION OF THE EMBODIMENTS

Figure 1:
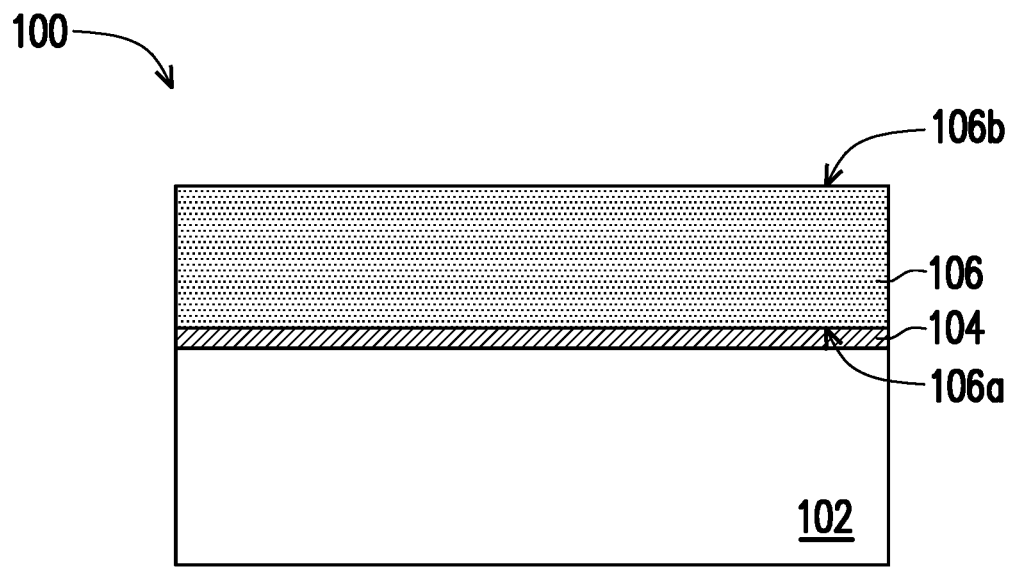
FIG. 1 is a schematic cross-sectional view of a bonding wafer structure according to a first embodiment of the disclosure.

Exemplary embodiments of the disclosure will be described comprehensively below with reference to the drawings, but the disclosure may be embodied in many different forms and should not be construed as being limited to the embodiments described herein. For clarity, in the drawings, sizes and thicknesses of regions, portions and layers may not be drawn based on actual scales. To facilitate understanding, the same components will hereinafter be denoted by the same reference numerals.

FIG. 1 is a schematic cross-sectional view of a bonding wafer structure according to a first embodiment of the disclosure.

Referring to FIG. 1, a bonding wafer structure 100 of the first embodiment basically includes a support substrate 102, a bonding layer 104, and a silicon carbide layer 106. The support substrate 102 is a substrate made of a strong material that has high rigidity and is not easily deformed, warped or damaged during processing. Examples of the strong material include a material having a Young's modulus of greater than 160 GPa, preferably a material having a Young's modulus of greater than 180 GPa. In one embodiment, the support substrate 102 has a total thickness variation (TTV) of, for example, less than 3 µm, preferably less than 1 µm. The support substrate 102 has a bow of, for example, less than 20 µm, preferably less than 15 µm. The support substrate 102 has a warp of, for example, less than 40 µm, preferably less than 30 µm. For example, the support substrate 102 is a silicon substrate, a sapphire substrate, a ceramic substrate, or a combination thereof. In other words, the support substrate 102 may have a single-layer or multi-layer structure. The bonding layer 104 is formed on a surface of the support substrate 102. The bonding layer 104 has a softening point of, for example, 50° C. to 200° C., preferably 80° C. to 150° C. When the softening point of the bonding layer 104 is set within the above range, the support substrate 102 and the silicon carbide layer 106 can subsequently be easily separated from each other simply by a high temperature method. The bonding layer 104 has a thickness of, for example, less than 100 µm, preferably 10 µm to 20 µm. The bonding layer 104 has uniformity of, for example, less than 10%, preferably less than 5%. For example, a material of the bonding layer 104 may be wax or a fixing glue. In view of the fact that the support substrate 102 and the silicon carbide layer 106 need to be adjusted and aligned during bonding, wax that has relatively high fluidity is preferably used as the material of the bonding layer 104. However, the disclosure is not limited thereto. In the case where the support substrate 102 and the silicon carbide layer 106 are accurately aligned, a fixing glue such as UV glue may also be used as the material of the bonding layer 104. Moreover, the bonding layer 104 may also have a single-layer or multi-layer structure.

Referring still to FIG. 1, the silicon carbide layer 106 is bonded onto the bonding layer 104, that is, the silicon carbide layer 106 is fixed onto the support substrate 102 via the bonding layer 104. A carbon surface 106a of the silicon carbide layer 106 is in direct contact with the bonding layer 104. A silicon surface 106b of the silicon carbide layer 106 is exposed and may be used for subsequent bonding with other epitaxy substrates (not shown). The silicon carbide layer 106 has a basal plane dislocation (BPD) of 1,000 ea/cm$^2$ to 20,000 ea/cm$^2$, for example, 4,000 ea/cm$^2$ to 10,000 ea/cm$^2$. The silicon carbide layer 106 has a total thickness variation (TTV) greater than that of the support substrate 102. The silicon carbide layer 106 has a diameter equal to or less than that of the support substrate 102. For example, the silicon carbide layer 106 before bonding has a TTV of less than 10 µm, preferably less than 5 µm. However, the silicon carbide layer 106 before bonding has a bow of, for example, greater than 75 µm or greater than 100 µm, and a warp of, for example, greater than 150 µm or greater than 200 µm. The reason that the silicon carbide layer 106 before bonding is relatively large in both bow and warp is that it employs a high-stress silicon carbide wafer adjacent to a seed crystal. However, since the bonding wafer structure 100 after bonding has a TTV of less than 10 µm, a bow of less than 30 µm, and a warp of less than 60 µm, the bonding wafer structure 100 can be used for an epitaxial process for a power device or a radio frequency (RF) device. In one embodiment, the bonding wafer structure 100 may have a TTV of less than 3 µm, a bow of less than 20 µm, and a warp of less than 40 µm. In the present embodiment, the silicon carbide layer 106 has a thickness of, for example, less than 500 µm, preferably less than 400 µm. The bonding wafer structure 100 has a thickness of, for example, less than 2,000 µm, preferably less than 1,000 µm. In addition, a concentricity of the silicon carbide layer 106 and the support substrate 102 is, for example, less than 1 mm, preferably less than 0.5 mm.

Figure 2:
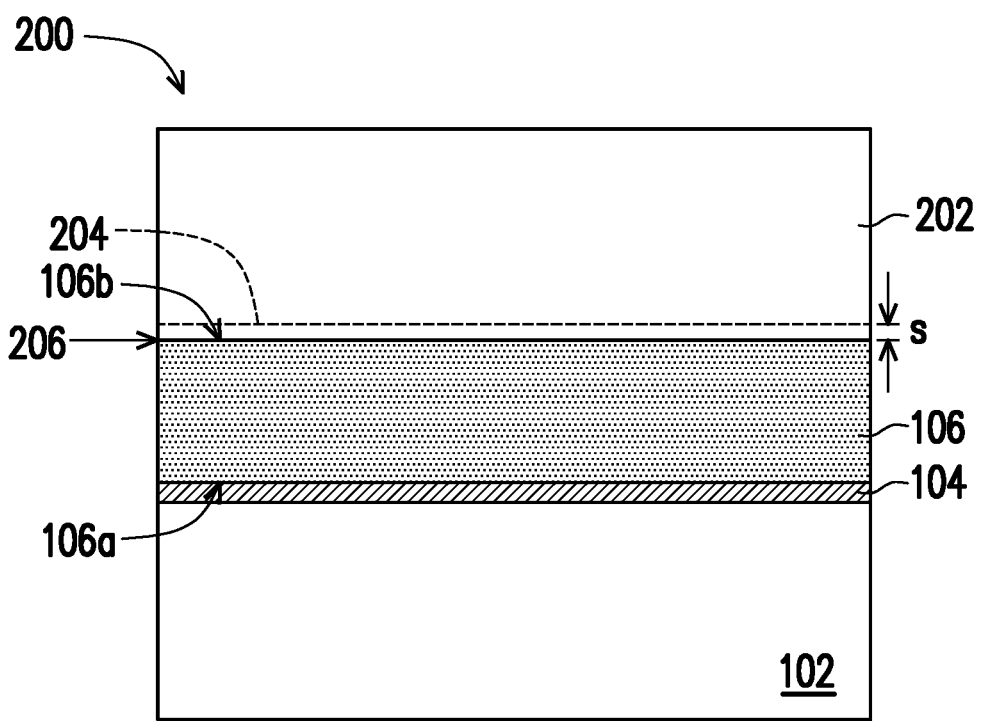
FIG. 2 is a schematic cross-sectional view of another bonding wafer structure according to the first embodiment of the disclosure.

FIG. 2 is a schematic cross-sectional view of another bonding wafer structure according to the first embodiment of the disclosure. The same reference numerals as those in FIG. 1 denote the same or similar members, and the same or similar members can be understood with reference to the description of FIG. 1 and repeated descriptions will be omitted.

In FIG. 2, a bonding wafer structure 200 may include an epitaxy silicon carbide substrate 202 bonded to the silicon surface 106b of the silicon carbide layer 106. The epitaxy silicon carbide substrate 202 has a BPD less than that of the silicon carbide layer 106, and a stress less than that of the silicon carbide layer 106. In addition, an ion implantation region 204 (that is, the region indicated by dashed lines) may be formed within the epitaxy silicon carbide substrate 202. The ion implantation region 204 is close to a bonding surface 206 between the epitaxy silicon carbide substrate 202 and the silicon carbide layer 106. In one embodiment, a distance s between the ion implantation region 204 and the bonding surface 206 is, for example, within 1 μm. Since the ion implantation region 204 causes a relatively fragile structure within the epitaxy silicon carbide substrate 202, the epitaxy silicon carbide substrate 202 and the silicon carbide layer 106 can subsequently be easily separated from each other from the ion implantation region 204.

Figure 3:
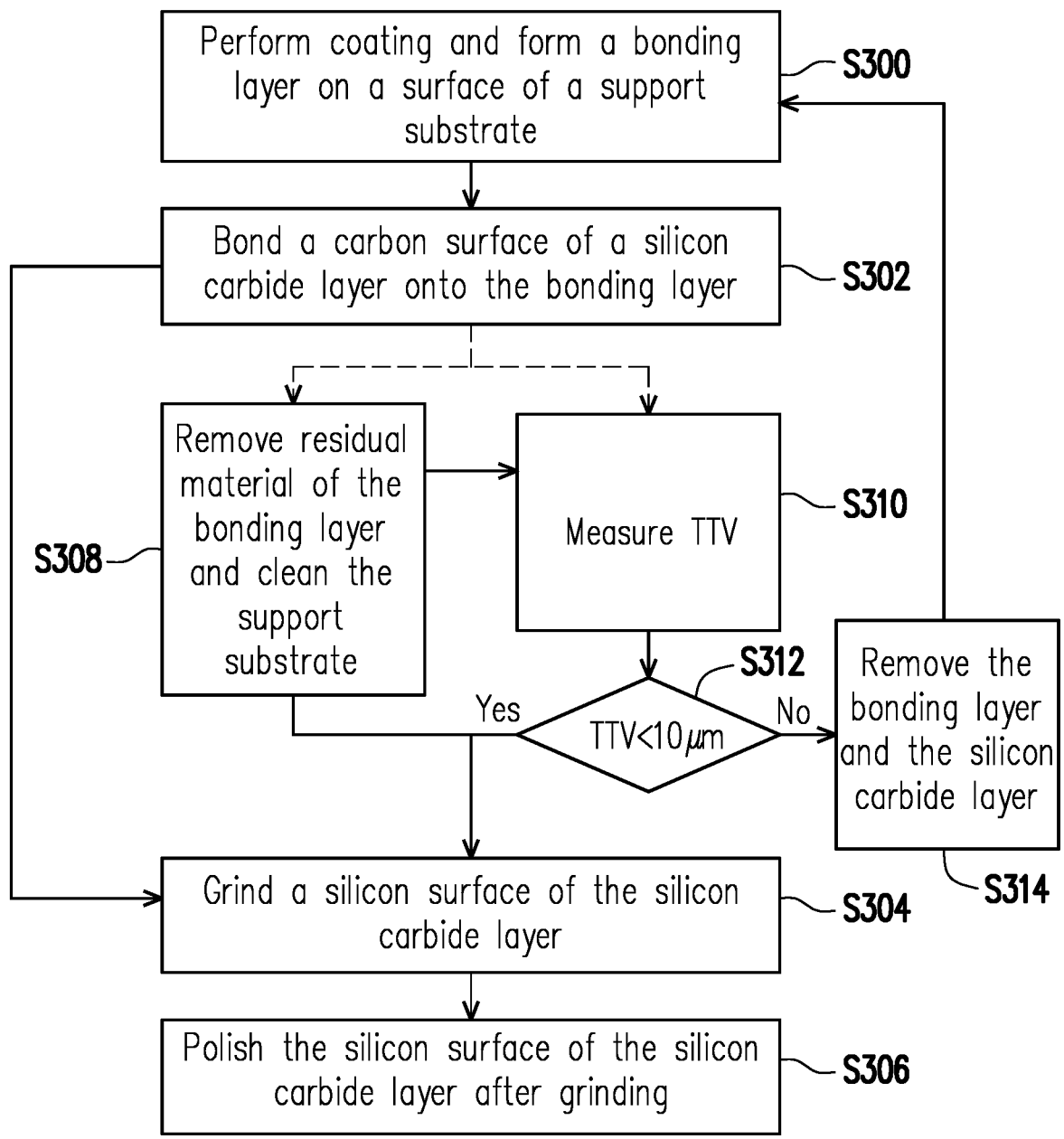
FIG. 3 is a flowchart of manufacturing a bonding wafer structure according to a second embodiment of the disclosure.

FIG. 3 is a flowchart of manufacturing a bonding wafer structure according to a second embodiment of the disclosure.

Referring to FIG. 3, firstly, step S300 is performed in which coating is performed and a bonding layer is formed on a surface of a support substrate. The bonding layer has a softening point of, for example, 50° C. to 200° C., preferably 80° C. to 150° C. If wax is used as a material of the bonding layer, liquid wax may be spin-coated on the surface of the support substrate at a temperature of 110° C. to 130° C. The support substrate has a Young's modulus of, for example, greater than 160 GPa, preferably greater than 180 GPa, a TTV of, for example, less than 3 μm, preferably less than 1 μm, a bow of, for example, less than 20 μm, preferably less than 15 μm, and a warp of, for example, less than 40 μm, preferably less than 30 μm. The support substrate is, for example, a silicon substrate, a sapphire substrate, a ceramic substrate, or a combination thereof. Moreover, the support substrate may have a single-layer or multi-layer structure. The bonding layer has a thickness of, for example, less than 100 μm, preferably 10 μm to 20 μm, and uniformity of, for example, less than 10%, preferably less than 5%.

Figure 4:
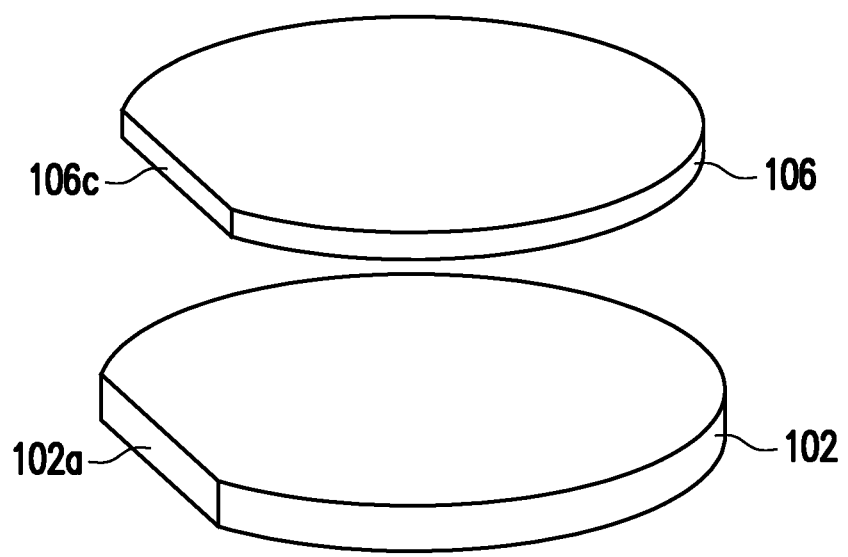
FIG. 4 is a schematic three-dimensional view of step S302 of the second embodiment.

Next, step S302 is performed in which a carbon surface of a silicon carbide layer is bonded onto the bonding layer. The silicon carbide layer has a TTV greater than that of the support substrate. The silicon carbide layer has a diameter equal to or less than that of the support substrate. The silicon carbide layer has a BPD of 1,000 ea/cm$^2$ to 20,000 ea/cm$^2$, for example, 4,000 ea/cm$^2$ to 10,000 ea/cm$^2$. The silicon carbide layer has a thickness of, for example, less than 500 μm, preferably less than 400 μm. The silicon carbide layer before bonding has a TTV of, for example, less than 10 μm, preferably less than 5 μm, but has a bow of greater than 75 μm, for example, greater than 100 μm, and a warp of greater than 150 μm, for example, greater than 200 μm. In the present embodiment, a method of bonding the silicon carbide layer is as shown in FIG. 4. A flat 102a of the support substrate 102 is aligned with a flat 106c of the silicon carbide layer 106, thereby reducing chipping that occurs at the flats during subsequent processing. For clarity, the bonding layer is omitted in FIG. 4. A load of the above bonding is, for example, greater than 8 kgf, preferably 8 kgf to 10 kgf. After step S302, a concentricity of the silicon carbide layer and the support substrate is, for example, less than 1 mm, preferably less than 0.5 mm.

Then, step S304 is performed in which a silicon surface of the silicon carbide layer is ground to reduce a thickness of the silicon carbide layer. The thickness of the silicon carbide layer reduced by grinding is, for example, 5 μm to 12 μm, preferably 8 μm to 12 μm. Accordingly, the silicon surface has a TTV of less than 5 μm, preferably less than 1 μm, and a wafer after grinding, as a whole, is relatively flat and has relatively good geometry.

Then, step S306 is performed in which the silicon surface of the silicon carbide layer after grinding is polished to obtain a bonding wafer structure. The polishing includes rough polishing and fine polishing. Accordingly, the silicon surface has a geometric TTV of less than 2 μm, preferably less than 1 μm. In one embodiment, roughnesses Ra after rough polishing and after fine polishing are as follows:

1. After rough polishing, a haze of 4.67 and Ra of 0.1 nm to 0.19 nm are achieved.
2. After fine polishing, a haze of 4.16 to 4.19 and Ra of 0.13 nm to 0.062 nm are achieved.

After step S306, the bonding wafer structure has a TTV of less than 10 μm (for example, less than 3 μm), a bow of less than 30 μm (for example, less than 20 μm), and a warp is less than 60 μm (for example, less than 40 μm). In other words, the silicon carbide layer before bonding and the bonding wafer structure after polishing have a change (Δbow) in bow of greater than 45 μm, preferably greater than 80 μm. The silicon carbide layer before bonding and the bonding wafer structure after polishing have a change (Δwarp) in warp of greater than 90 μm, preferably greater than 160 μm. The bonding wafer structure has a thickness of, for example, less than 2,000 μm, preferably less than 1,000 μm.

In addition, after step S302, step S308 may be performed first, in which residual material of the bonding layer is removed and the support substrate is cleaned.

In view of the yield of the subsequent epitaxial process, before step S304, step S310 may be performed in which a TTV of the support substrate, the bonding layer and the silicon carbide layer that are bonded together is measured. Then, in step S312, if the TTV is less than 10 μm, the subsequent step S304 is performed. Otherwise, if the TTV is equal to or greater than 10 μm, step S314 is performed first, in which the bonding layer and the silicon carbide layer are removed. Then, the process returns to step S300 in which coating is performed and another bonding layer is formed on the surface of the original support substrate. Step S310 may be performed after step S302 or after step S308.

The following describes several experiments for verification of the effect of the disclosure. However, the disclosure is not limited to the following content.

Analysis Method

1. Thickness: wafer thickness was measured by a non-contact instrument (MX-203/FRT/ADE7000).
2. TTV, warp, and bow: measurement was performed by a non-contact instrument.
3. BPD: measurement was performed by automated optical inspection (AOI) and density was calculated.

Experimental Example 1

Step 1) Wax was spin-coated on a surface of a silicon carbide layer and a silicon substrate at room temperature (the thickness was not limited and depended on the fixtures in the current process), the resultant was placed on a 120° C. heating plate, and heated for 60 seconds.

Step 2) The silicon carbide layer and the silicon substrate were bonded to each other so that a flat of the silicon substrate was aligned with a flat of the silicon carbide layer, and the resultant was left to stand for 60 seconds with a load of greater than 8 kgf applied thereon. The silicon carbide layer had a BPD of about 4,048 ea/cm$^2$.

Step 3) A silicon surface of the silicon carbide layer was ground by about 5 μm.

Step 4) The silicon surface of the silicon carbide layer after grinding was polished at a temperature of 35° C. to 60° C. By setting the temperature within this range, wafer edge peeling can be prevented and a sufficient removal amount can be ensured. The removal amount by polishing was about 1 μm, and a bonding wafer structure was obtained.

The silicon substrate and the silicon carbide layer alone (before bonding) were measured for flatness characteristics, and the results are described in Table 1 below. Then, after each of steps 2), 3), and 4), the whole structure was measured for flatness characteristics, and the results are described in Table 1 below.

Experimental Example 2

A bonding wafer structure was prepared in the same manner as in Experimental Example 1 except that the silicon carbide layer had a BPD of about 4,002 ea/cm². Then, the structures at each stage were measured for flatness characteristics, and the results are described in Table 1 below.

Experimental Example 3

A bonding wafer structure was prepared in the same manner as in Experimental Example 1 except that the silicon carbide layer had a BPD of about 3,957 ea/cm². Then, the structures at each stage were measured for flatness characteristics, and the results are described in Table 1 below.

bonding wafer structure can be used for an epitaxial process for a power device or a radio frequency (RF) device.

In summary, in the bonding wafer structure of the disclosure, a silicon carbide layer of low quality (high stress) is used to replace part of an existing support substrate, and is directly bonded to an epitaxy silicon carbide substrate. Moreover, in the bonding wafer structure after the above bonding process, the support substrate and the low-quality silicon carbide layer can be separated from each other simply by a high temperature method, making it possible to reuse the support substrate. Therefore, not only the material cost of the support substrate but also the cost of discarding low-quality SiC epitaxial wafer can be reduced. Moreover, in the disclosure, the bonding wafer structure having high flatness makes it easy to perform a bonding process, improves the yield of wafer bonding, and is suitable for application in the epitaxial process for a power device or a radio frequency device.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:
1. A bonding wafer structure, comprising:
   a support substrate;

TABLE 1

| Experimental Example | Measurement object | Process | Thickness (μm) | TTV (μm) | BOW (μm) | Wrap (μm) |
|---|---|---|---|---|---|---|
| 1 | Silicon carbide layer alone | Before bonding (step 1) | 365.85 | 0.95 | 136.03 | 232.40 |
|   | Silicon substrate | Before bonding (step 1) | 550.64 | 0.60 | 10.37 | 1.23 |
|   | Bonding structure | After bonding (step 2) | 916.49 | 3.46 | 20.25 | 39.30 |
|   | Bonding structure after grinding | After grinding (step 3) | 911.48 | 0.91 | 29.59 | 56.02 |
|   | Bonding structure after polishing | After polishing (step 4) | 910.50 | 0.94 | 18.73 | 41.29 |
| 2 | Silicon carbide layer alone | Before bonding (step 1) | 365.90 | 1.00 | 111.39 | 193.36 |
|   | Silicon substrate | Before bonding (step 1) | 554.19 | 0.59 | 9.97 | 2.71 |
|   | Bonding structure | After bonding (step 2) | 920.09 | 2.51 | 20.04 | 38.88 |
|   | Bonding structure after grinding | After grinding (step 3) | 911.63 | 1.07 | 28.65 | 54.92 |
|   | Bonding structure after polishing | After polishing (step 4) | 910.65 | 1.11 | 18.04 | 38.62 |
| 3 | Silicon carbide layer alone | Before bonding (step 1) | 365.88 | 0.71 | 100.03 | 174.60 |
|   | Silicon substrate | Before bonding (step 1) | 551.23 | 0.54 | 15.02 | −5.47 |
|   | Bonding structure | After bonding (step 2) | 917.11 | 4.01 | 18.50 | 39.04 |
|   | Bonding structure after grinding | After grinding (step 3) | 911.83 | 1.30 | 28.40 | 57.24 |
|   | Bonding structure after polishing | After polishing (step 4) | 910.65 | 1.23 | 18.26 | 41.46 |

As is clear from the table above, the silicon carbide layer alone before bonding was relatively high in both bow and warp (greater than 100 and greater than 200, respectively). In Experimental Examples 1 to 3, after the bonding in step 2), the bow and the warp were greatly reduced (less than about 20 and less than about 40, respectively). Therefore, the a bonding layer, formed on a surface of the support substrate; and
a silicon carbide layer, bonded onto the bonding layer, wherein a carbon surface of the silicon carbide layer is in direct contact with the bonding layer, the silicon carbide layer has a basal plane dislocation (BPD) of 1,000 ea/cm² to 20,000 ea/cm², the silicon carbide layer has a total thickness variation (TTV) greater than a TTV of the support substrate, and the silicon carbide layer has a diameter equal to or less than a diameter of the support substrate, and the bonding wafer structure has a TTV of less than 10 μm, a bow of less than 30 μm, and a warp of less than 60 μm.

2. The bonding wafer structure according to claim 1, wherein the silicon carbide layer has a thickness of less than 500 μm, and the bonding wafer structure has a thickness of less than 2,000 μm.

3. The bonding wafer structure according to claim 1, wherein the bonding layer has a softening point of 50° C. to 200° C., a thickness of less than 100 μm, and uniformity of less than 10%.

4. The bonding wafer structure according to claim 1, wherein the support substrate has a TTV of less than 3 μm, a bow of less than 20 μm, a warp of less than 40 μm, and a Young's modulus of greater than 160 GPa.

5. The bonding wafer structure according to claim 1, wherein the support substrate comprises a single-layer or multi-layer structure, and the bonding layer comprises a single-layer or multi-layer structure.

6. The bonding wafer structure according to claim 1, wherein a concentricity of the silicon carbide layer and the support substrate is less than 1 mm.

7. The bonding wafer structure according to claim 1, further comprising an epitaxy silicon carbide substrate bonded to a silicon surface of the silicon carbide layer, the epitaxy silicon carbide substrate has a BPD less than the BPD of the silicon carbide layer, and the epitaxy silicon carbide substrate has a stress less than a stress of the silicon carbide layer.

8. The bonding wafer structure according to claim 7, further comprising an ion implantation region formed within the epitaxy silicon carbide substrate, wherein the ion implantation region is at a distance of within 1 μm from a bonding surface between the epitaxy silicon carbide substrate and the silicon carbide layer.

9. A method of manufacturing a bonding wafer structure, comprising:

performing coating and forming a bonding layer on a surface of a support substrate;

bonding a carbon surface of a silicon carbide layer onto the bonding layer, wherein the silicon carbide layer has a total thickness variation (TTV) greater than a TTV of the support substrate, the silicon carbide layer has a diameter equal to or less than a diameter of the support substrate, the silicon carbide layer has a basal plane dislocation (BPD) of 1,000 ea/cm² to 20,000 ea/cm², and the silicon carbide layer has a bow of greater than 75 μm and a warp of greater than 150 μm before bonding;

grinding a silicon surface of the silicon carbide layer to reduce a thickness of the silicon carbide layer; and polishing the silicon surface of the silicon carbide layer after grinding to obtain a bonding wafer structure, wherein the bonding wafer structure has a TTV of less than 10 μm, a bow of less than 30 μm, and a warp of less than 60 μm.

10. The method of manufacturing the bonding wafer structure according to claim 9, wherein bonding the carbon surface of the silicon carbide layer onto the bonding layer comprises aligning a flat of the support substrate with a flat of the silicon carbide layer.

11. The method of manufacturing the bonding wafer structure according to claim 9, wherein a load of bonding the carbon surface of the silicon carbide layer onto the bonding layer is 8 kgf to 10 kgf.

12. The method of manufacturing the bonding wafer structure according to claim 9, further comprising, after bonding the carbon surface of the silicon carbide layer onto the bonding layer, removing residual material of the bonding layer and cleaning the support substrate.

13. The method of manufacturing the bonding wafer structure according to claim 9, wherein a thickness of the silicon carbide layer reduced by the grinding is 5 μm to 12 μm.

14. The method of manufacturing the bonding wafer structure according to claim 9, wherein the silicon carbide layer before the bonding and the bonding wafer structure after the polishing have a change (Δbow) in bow of greater than 80 μm, and a change (Δwarp) in warp of greater than 160 μm.

15. The method of manufacturing the bonding wafer structure according to claim 9, wherein performing coating and forming the bonding layer comprises spin-coating wax on the surface of the support substrate at a temperature of 110° C. to 130° C.

16. The method of manufacturing the bonding wafer structure according to claim 9, further comprising, before grinding the silicon surface of the silicon carbide layer:

measuring the TTV of the support substrate, the bonding layer and the silicon carbide layer that are bonded together; and performing a subsequent step in response to the measured TTV being less than 10 μm, and otherwise, removing the bonding layer and the silicon carbide layer and then again performing coating and forming a bonding layer on the surface of the support substrate in response to the measured TTV being equal to or greater than 10 μm.

17. The method of manufacturing the bonding wafer structure according to claim 9, wherein the polishing comprises rough polishing and fine polishing.

\* \* \* \* \*